(12) United States Patent
Chen et al.

(10) Patent No.: US 9,153,601 B2
(45) Date of Patent: Oct. 6, 2015

(54) SEMICONDUCTOR DEVICE

(71) Applicant: AU Optronics Corporation, Hsin-Chu (TW)

(72) Inventors: Shin-Shueh Chen, Hsin-Chu (TW); Po-Hsueh Chen, Hsin-Chu (TW)

(73) Assignee: AU OPTRONICS CORPORATION, Hsin-Chu (TW)

(*) Notice: Subject to any disclaimer, the term of this patent is extended or adjusted under 35 U.S.C. 154(b) by 0 days.

(21) Appl. No.: 14/265,624

(22) Filed: Apr. 30, 2014

(65) Prior Publication Data

US 2014/0332799 A1  Nov. 13, 2014

(30) Foreign Application Priority Data

May 8, 2013  (TW) .............................. 102116368 U

(51) Int. Cl.
| | |
|---|---|
| H01L 29/786 | (2006.01) |
| H01L 21/31 | (2006.01) |
| H01L 27/12 | (2006.01) |
| H01L 29/66 | (2006.01) |
| H01L 21/336 | (2006.01) |
| H01L 21/30 | (2006.01) |

(52) U.S. Cl.
CPC ........ *H01L 27/1225* (2013.01); *H01L 27/1248* (2013.01); *H01L 29/66742* (2013.01); *H01L 29/7869* (2013.01); *H01L 21/3003* (2013.01)

(58) Field of Classification Search
CPC ............ H01L 29/7869; H01L 21/3185; H01L 27/1225; H01L 29/66969; H01L 29/2003
See application file for complete search history.

(56) References Cited

U.S. PATENT DOCUMENTS

| | | | | |
|---|---|---|---|---|
| 2011/0133179 | A1* | 6/2011 | Yamazaki | 257/43 |
| 2011/0133180 | A1* | 6/2011 | Yamazaki | 257/43 |
| 2012/0146728 | A1 | 6/2012 | Makiyama et al. | |
| 2012/0181533 | A1* | 7/2012 | Yoo et al. | 257/43 |
| 2013/0049002 | A1 | 2/2013 | Chen et al. | |
| 2014/0217396 | A1* | 8/2014 | Imamura et al. | 257/43 |

FOREIGN PATENT DOCUMENTS

| | | |
|---|---|---|
| CN | 102544088 | 7/2012 |
| JP | 2001183639 | 7/2001 |
| TW | 1295816 B | 4/2008 |
| TW | 201005950 A | 2/2010 |
| TW | 201036168 A | 10/2010 |
| TW | 201310656 | 3/2013 |

* cited by examiner

*Primary Examiner* — Victor A Mandala
*Assistant Examiner* — Regan J Rundio
(74) *Attorney, Agent, or Firm* — WPAT, PC; Justin King

(57) ABSTRACT

A semiconductor device includes a substrate, a gate electrode, an insulating layer, a source electrode, a drain electrode, a semiconductor channel layer, a first passivation layer and a second passivation layer. The gate is formed on the substrate. The insulating layer covers the gate electrode. The source electrode and the drain electrode are positioned on the insulating layer. The semiconductor channel layer is disposed on the insulating layer, and connects the source electrode and the drain electrode. The first passivation layer covers the source electrode, the drain electrode and the semiconductor channel layer. The first passivation layer includes silicon oxide. The second passivation layer is disposed on the first passivation layer. The second passivation layer includes silicon nitride that has a hydrogen concentration of about $2.0 \times 10^{22}$ atom/$cm^3$ to about $3.11 \times 10^{22}$ atom/$cm^3$.

10 Claims, 5 Drawing Sheets

SEMICONDUCTOR DEVICE

RELATED APPLICATIONS

This application claims priority to Taiwan Application Serial Number 102116368, filed May 8, 2013, which is herein incorporated by reference.

BACKGROUND

1. Technical Field

The present invention relates to a semiconductor device. More particularly, the present invention relates to a metal-oxide semiconductor device.

2. Description of Related Art

Metal-oxide semiconductors possess high carrier mobility, and accordingly much attention has been given thereto. As compared to amorphous silicon thin-film transistors (TFTs), metal oxide semiconductor TFTs exhibit better electrical performance. In addition, the method of manufacturing metal-oxide semiconductor TFTs is simpler than that of low temperature polycrystalline silicon TFTs. Therefore, much research has focused on metal-oxide semiconductor TFTs in recent years. Unfortunately, metal-oxide semiconductor materials are very sensitive and unstable so that the semiconductor device cannot achieve satisfactory stability and reliability nowadays. In view of the above, there exists in this art a need of an improved semiconductor device that provides excellent stability and reliability.

SUMMARY

According to an aspect of the present disclosure, a semiconductor device having an excellent reliability is provided. The semiconductor device includes a substrate, a gate electrode, an insulating layer, a source electrode, a drain electrode, a semiconductor channel layer, a first passivation layer and a second passivation layer. The gate electrode is disposed on the substrate. The insulating layer covers the gate electrode. The source electrode and the drain electrode are positioned on the insulating layer. The semiconductor channel layer is disposed on the insulating layer, and connects the source electrode and the drain electrode. The first passivation layer covers the semiconductor channel layer, the source electrode and the drain electrode, and the first passivation layer includes silicon oxide. The second passivation layer is disposed on the first passivation layer, in which the second passivation layer includes silicon nitride, and the hydrogen concentration of the second passivation layer is about $2.0 \times 10^{22}$ atom/cm$^3$ to about $3.11 \times 10^{22}$ atom/cm$^3$.

According to one embodiment of the present disclosure, the second passivation layer has a thickness of about 300 angstrom to about 700 angstrom.

According to one embodiment of the present disclosure, the first passivation layer has a thickness of about 1000 angstrom to about 3000 angstrom.

According to one embodiment of the present disclosure, the semiconductor device further includes a channel protective layer, in which the channel protective layer is disposed between the semiconductor channel layer and the first passivation layer, and the channel protective layer overlaps the semiconductor channel layer in a perpendicular projection direction.

According to one embodiment of the present disclosure, a material of the channel protective layer includes silicon oxide.

According to one embodiment of the present disclosure, the semiconductor channel layer is disposed on the source electrode and the drain electrode, and a side of the semiconductor channel layer covers a portion of the source electrode, whereas another side of the semiconductor channel layer covers a portion of the drain electrode.

According to one embodiment of the present disclosure, the semiconductor channel layer is disposed between the insulating layer, the source electrode and the drain electrode, in which a portion of the source electrode covers a side of the semiconductor channel layer, and a portion of the drain electrode covers another side of the semiconductor channel layer.

According to one embodiment of the present disclosure, the semiconductor channel layer overlaps the gate electrode in a perpendicular projection direction.

According to one embodiment of the present disclosure, the semiconductor channel layer includes at least one metal oxide material selected from the group consisting of indium-gallium-zinc oxide (IGZO), indium-zinc oxide (IZO), indium-gallium oxide (IGO), zinc oxide (ZnO), cadmium oxides.germanium dioxide ($2CdO.GeO_2$), nickel cobalt oxide ($NiCo_2O_4$) and a combination thereof.

According to one embodiment of the present disclosure, the semiconductor device further includes a planarization layer and a pixel electrode. The planarization layer covers the second passivation layer. The first passivation layer, the second passivation layer and the planarization layer respectively have a first opening, a second opening and a third opening, in which the first opening, the second opening and the third opening are communicated with each other so as to expose the drain electrode. The pixel electrode is positioned on a portion of the planarization layer, and the pixel electrode contacts and electrically connects to the drain electrode through the first opening, the second opening and the third opening.

BRIEF DESCRIPTION OF THE DRAWINGS

The present disclosure can be more fully understood by reading the following detailed description of the embodiments, with reference made to the accompanying drawings as follows.

DETAILED DESCRIPTION

Figure 1:
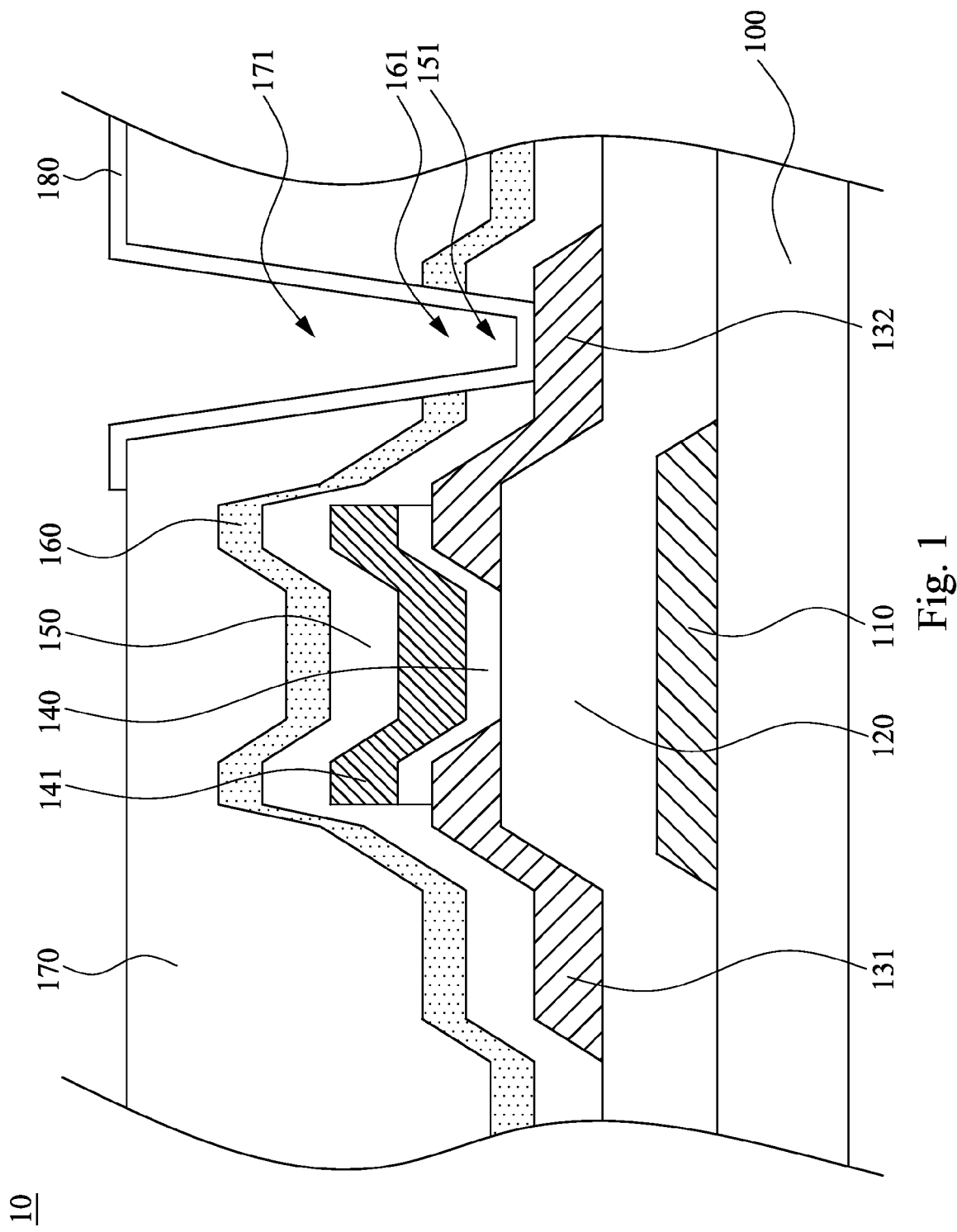
FIG. 1 is a cross-sectional view schematically illustrating a semiconductor device according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

FIG. 1 is a cross-sectional view schematically illustrating a semiconductor device 10 according to one embodiment of the present disclosure. The semiconductor device 10 includes a gate electrode 110, an insulating layer 120, a source electrode 131, a drain electrode 132, a semiconductor channel layer 140, a first passivation layer 150 and a second passivation layer 160. The semiconductor device 10 may be formed on any suitable substrate such as a glass substrate, a polyethylene terephthalate (PET) substrate, a polyethylene naphthalate (PEN) substrate, a polyimide substrate, a polycarbonate substrate or a stainless steel substrate.

The gate electrode 110 is disposed on the substrate 100, and the gate electrode 110 may be formed by a sputtering process, a pulsed laser vapor deposition process, an E-beam evaporation deposition process, or a chemical vapor deposition process. The gate electrode 110 may have a signal-layered structure or a multiple-layered structure. Furthermore, the gate electrode 110 may be made of a conductive metallic material such as platinum, gold, nickel, aluminum, molybdenum, copper, neodymium, an alloy thereof or a combination thereof. In addition, typical photolithography and etching processes may be used to form the pattern of the gate electrode 110.

The insulating layer 120 is formed over the gate electrode 110 and covers the gate electrode 110 in order to prevent the gate electrode 110 from contact with the source electrode 131, the drain electrode 132 and the semiconductor channel layer 140. The insulating layer 120 may be formed by a sputtering process, a pulsed laser vapor deposition process, an E-beam evaporation deposition process, or a chemical vapor deposition process. The insulating layer 120 may be made of an organic polymeric material with a suitable dielectric property or an inorganic material such as silicon oxide or silicon nitride.

The source electrode 131 and the drain electrode 132 are disposed on the insulating layer 120 at a position above the gate electrode 110. In general, the source electrode 131 and the drain electrode 132 may comprise a metallic material such as platinum, gold, nickel, aluminum, molybdenum, copper, neodymium, etc. The source electrode 131 and the drain electrode 132 may be formed by a sputtering process, a pulsed laser vapor deposition process, an E-beam evaporation deposition process, or a chemical vapor deposition process. Furthermore, typical photolithography and etching processes may be used to form the patterns of the source electrode 131 and the drain electrode 132.

The semiconductor channel layer 140 is disposed on the insulating layer 120, and connects the source electrode 131 with the drain electrode 132. In this embodiment, as shown in FIG. 1, a side of the semiconductor channel layer 140 covers a portion of the source electrode 131 whereas another side of the semiconductor channel layer 140 covers a portion of the drain electrode 132. In other words, a portion of the semiconductor channel layer 140 is disposed on the source electrode 131 and the drain electrode 132, and another portion of the semiconductor channel layer 140 is disposed on the insulating layer 120 at a position between the source electrode 131 and the drain electrode 132. According to some embodiments of the present disclosure, the semiconductor channel layer 140 comprises at least one metal oxide such as indium-gallium-zinc oxide (IGZO), indium-zinc oxide (IZO), indium-gallium oxide (IGO), zinc oxide (ZnO), cadmium oxides.germanium dioxide ($2CdO.GeO_2$), nickel cobalt oxide ($NiCo_2O_4$) or a combination thereof.

The first passivation layer 150 comprises silicon oxide, and covers the semiconductor channel layer 140, the source electrode 131, the drain electrode 132 and the insulating layer 120. The first passivation layer 150 may be about 1000 angstrom to about 3000 angstrom in thickness. The second passivation layer 160 is disposed on the first passivation layer 150, in which the second passivation layer 160 comprises silicon nitride. The second passivation layer 160 may have a thickness of about 300 angstrom to about 700 angstrom. It is noted that the second passivation layer 160 has a hydrogen concentration of about $2.0 \times 10^{22}$ atom/cm$^3$ to about $3.11 \times 10^{22}$ atom/cm$^3$. In general, the silicon nitride layer includes a trace amount of hydrogen element, which is mixed together therein during the formation of the silicon nitride layer. For instance, when chemical vapor deposition (CVD) techniques are employed to form the silicon nitride layer, silane ($SiH_4$), ammonia ($NH_3$) and nitrogen gas ($N_2$) are unitized as gas sources, in which silane provides the silicon atom of the silicon nitride whereas ammonia ($NH_3$) and nitrogen ($N_2$) provide the nitrogen atom of the silicon nitride. Since both silane ($SiH_4$) and ammonia ($NH_3$) contain hydrogen atom, a little amount of hydrogen atoms are blended within the deposited layer of silicon nitride during the CVD process, and therefore the silicon nitride layer contains a little amount of hydrogen element. In this embodiment, the hydrogen concentration of the second passivation layer 160 is ranged from about $2.0 \times 10^{22}$ atom/cm$^3$ to about $3.11 \times 10^{22}$ atom/cm$^3$, and this concentration range of hydrogen is critical. In particular, when the hydrogen concentration of the silicon nitride of the second passivation layer 160 is within the aforesaid range, the reliability of the semiconductor device 10 may be significantly improved, and more importantly the semiconductor device 10 exhibits better characteristics as compared to a conventional semiconductor device. More specifically, when the hydrogen concentration of the silicon nitride of the second passivation layer 160 is within the aforesaid range, the threshold voltage of the semiconductor device 10 does not undergo a substantial change after a reliability test under a high humidity and high temperature condition for 300 hours, as compared to the initial threshold voltage of the semiconductor device 10 prior to the reliability test.

In this embodiment, the first passivation layer 150 and the second passivation layer 160 respectively have a first opening 151 and a second opening 161. The second opening 161 is positioned above the first opening 151, and the second opening 161 is communicated with (i.e. connected to) the first opening 151. Furthermore, the first opening 151 and the second opening 161 are positioned above the drain electrode 132, and therefore the drain electrode 132 may be exposed through the first opening 151 and the second opening 161.

In another embodiment, the semiconductor device 10 further includes a channel protective layer 141, which is disposed between the semiconductor channel layer 140 and the first passivation layer 150. The normal projection of the channel protective layer 141 onto the insulating layer 120 overlaps the normal projection of the semiconductor channel layer 140 onto the insulating layer 120. In other words, the channel protective layer 141 overlaps the semiconductor channel layer 140 in a perpendicular projection direction. In one example, the channel protective layer 141 is disposed on the semiconductor channel layer 140, and the channel protective layer 141 and the semiconductor channel layer 140 have an identical pattern. Specifically, a single photolithography process may be unitized to pattern the channel protective layer 141 and the semiconductor channel layer 140, and therefore both the channel protective layer 141 and the semiconductor channel layer 140 have a substantially identical pattern. The material of the channel protective layer 141 may be silicon oxide, for example.

In still another embodiment, the semiconductor device 10 further includes a planarization layer 170 and a pixel electrode 180. The planarization layer 170 covers the second passivation layer 160. Furthermore, the planarization layer 170 has a third opening 171. The third opening 171 is communicated with both the second opening 161 and the first opening 151. Specifically, the third opening 171 is positioned above the second opening 161 which is positioned above the first opening 151. A single photolithography process may be unitized to form the first opening 151, the second opening 161 and the third opening 171. In addition, the pixel electrode 180 is located on a portion of the planarization layer 170. The pixel electrode 180 may be electrically connected to and in contact with the drain electrode 132 through the first opening 151, the second opening 161 and the third opening 171.

Figure 2:
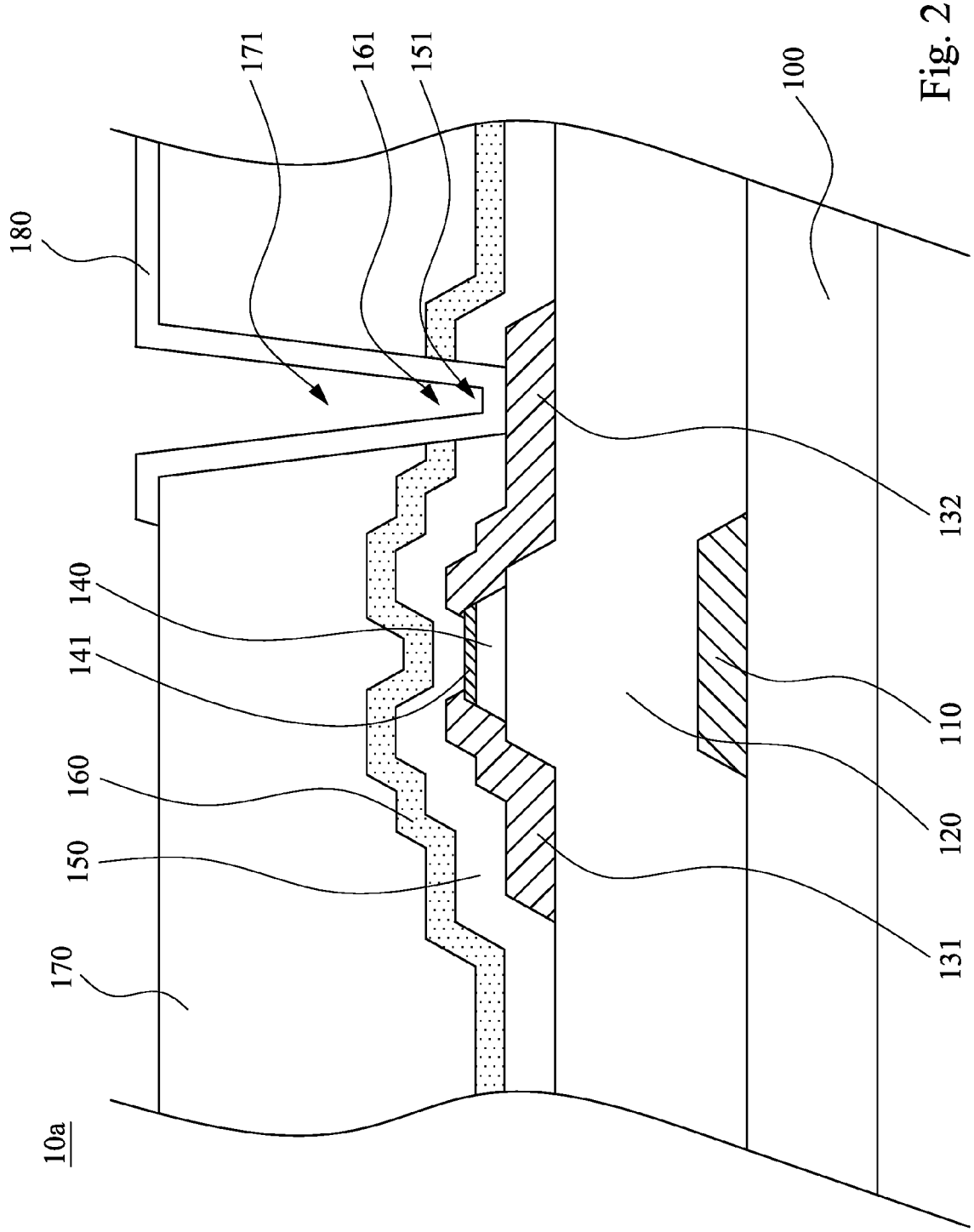
FIG. 2 is a cross-sectional view schematically illustrating a semiconductor device according to another embodiment of the present disclosure.

FIG. 2 is a cross-sectional view schematically illustrating a semiconductor device 10a according to another embodiment of the present disclosure. In FIG. 2 and FIG. 1, the same reference numbers are used to refer to the same elements, and the details thereof may be same as these described hereinbefore. In this embodiment, the arrangement of the source electrode 131, the drain electrode 132 and the semiconductor channel layer 140 of the semiconductor device 10a is different from those of the semiconductor device 10 depicted in FIG. 1. As shown in FIG. 2, a portion of the source electrode 131 covers a side of the semiconductor channel layer 140, whereas another side of the semiconductor channel layer 140 is covered by a portion of the drain electrode 132. In other words, the semiconductor channel layer 140 is disposed between the insulating layer 120, the source electrode 131 and the drain electrode 132, and the semiconductor channel layer 140 overlaps a part of the gate electrode 110 in a perpendicular projection direction. In other embodiments, the semiconductor device 10a does not include the channel protective layer 141 on the semiconductor channel layer 140. That is, the channel protective layer 141 is an optional arrangement, and therefore the present disclosure is not limited thereto.

Figure 3:
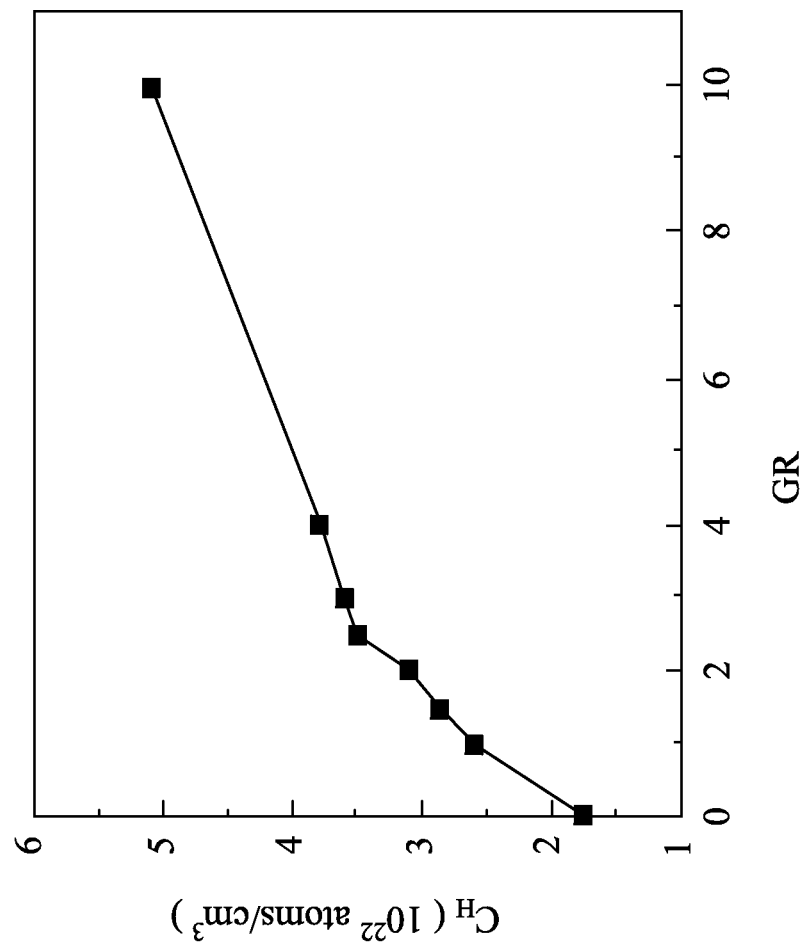
FIG. 3 is a graph showing the relationship between the hydrogen concentration ($C_H$) of the second passivation layer and the flow rate ratio of ammonia/silane (GR) according to one embodiment of the present disclosure.

FIG. 3 is a graph showing the relationship between the hydrogen concentration ($C_H$) of the second passivation layer and the flow rate ratio of ammonia to silane (GR) in a CVD process, according to one embodiment of the present disclosure. It may be observed in FIG. 3 that the hydrogen concentration ($C_H$) increases as the flow rate ratio (GR) of ammonia to silane is increased.

Figure 4:
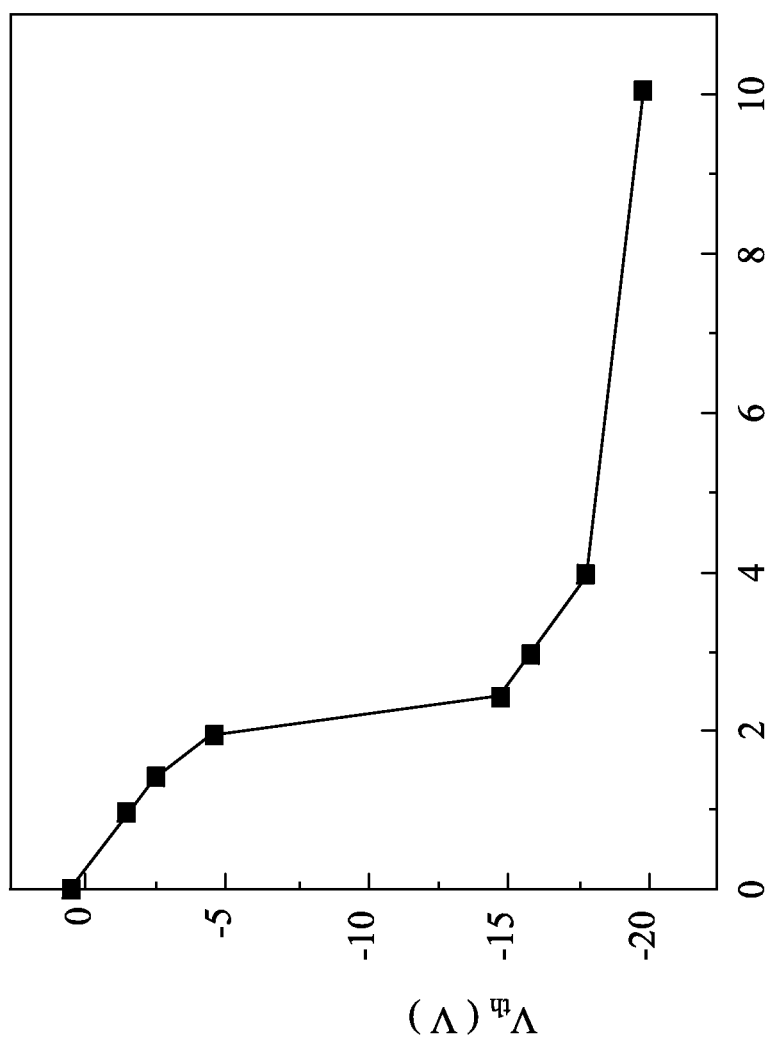
FIG. 4 is a graph showing the relationship between the initial threshold voltage ($V_{th}$) of a semiconductor device and the flow rate ratio of ammonia/silane (GR) according to one embodiment of the present disclosure.

FIG. 4 is a graph showing the relationship between the initial threshold voltage ($V_{th}$) of a semiconductor device and the flow rate ratio of ammonia to silane (GR), according to one embodiment of the present disclosure. The initial threshold voltage in FIG. 4 is measured before the associated semiconductor device experienced the reliability test under high temperature and high humidity condition. It may be observed in FIG. 4 that when the flow rate ratio of ammonia to silane (GR) is between about 1 to about 2, the initial threshold voltage of the semiconductor device is between about −1 V to about −5 V, and therefore the semiconductor device is suitable to be applied in practical electronic devices. Nevertheless, when the flow rate ratio of ammonia to silane (GR) is equal to or greater than about 2.5, the initial threshold voltage of the semiconductor device is decreased to a level of less than −15 V. The semiconductor device with a threshold voltage of less than −15 V is uneasy to be applied in practical electronic devices.

Figure 5:
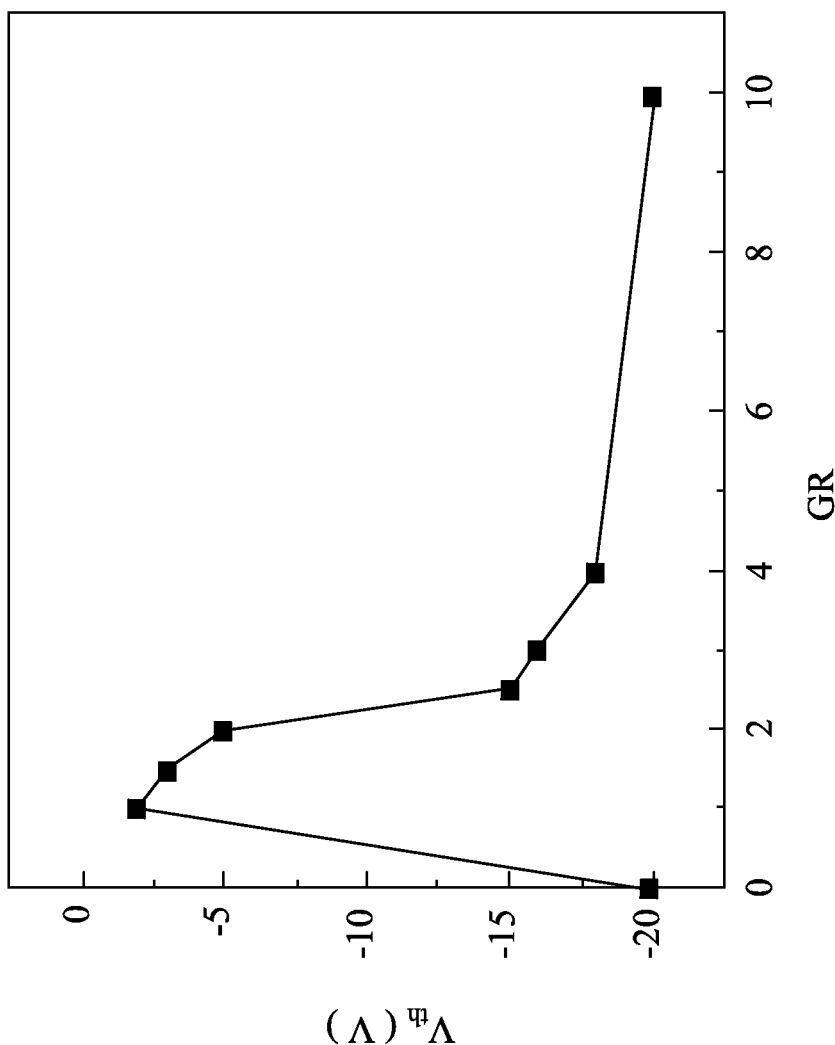
FIG. 5 is a graph showing the relationship between the threshold voltage ($V_{th}$) of a semiconductor device and the flow rate ratio of ammonia/silane (GR) according to one embodiment of the present disclosure, in which the threshold voltage ($V_{th}$) is measured after the semiconductor device experienced a reliability test under a high humidity and high temperature condition for 300 hours.

FIG. 5 is a graph showing the relationship between the threshold voltage ($V_{th}$) of a semiconductor device and the flow rate ratio of ammonia to silane (GR) according to one embodiment of the present disclosure, in which the threshold voltage ($V_{th}$) is measured after the semiconductor device experienced a reliability test under a high humidity and high temperature condition for 300 hours. It may be observed in FIG. 5 that when the flow rate ratio of ammonia to silane (GR) is greater than or equal to about 2.5, the threshold voltage of the semiconductor device is too low, and the semiconductor device is uneasy to be applied in electronic devices although the threshold voltage is not changed by the reliability test. In this embodiment, when the flow rate ratio of ammonia to silane (GR) is between about 1 to about 2, the threshold voltage of the semiconductor device after the reliability test for 300 hours is kept substantially the same as the initially threshold voltage (i.e. before the reliability test). After further research and analysis, it is found that when the hydrogen concentration ($C_H$) of the silicon nitride layer is between about $2.0 \times 10^{22}$ atom/cm$^3$ and about $3.11 \times 10^{22}$ atom/cm$^3$, the semiconductor device not only exhibits an excellent reliability but also has a practicable threshold voltage. More specifically, when the hydrogen concentration ($C_H$) of the silicon nitride layer is less than about $2.0 \times 10^{22}$ atom/cm$^3$, the characteristics of the semiconductor device are unstable, and therefore the semiconductor device may not pass the reliability test. On the other hand, when the hydrogen concentration ($C_H$) of the silicon nitride layer is greater than about $3.11 \times 10^{22}$, the threshold voltage of the semiconductor device is too low and the semiconductor device is uneasy to be applied in electronic devices. Significantly, when the hydrogen concentration ($C_H$) of the silicon nitride layer is between about $2.0 \times 10^{22}$ atom/cm$^3$ and about $3.11 \times 10^{22}$ atom/cm$^3$, the semiconductor device simultaneously has an excellent reliability and a practicable threshold voltage.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A semiconductor device, comprising:
   a substrate;
   a gate electrode disposed on the substrate;
   an insulating layer covering the gate electrode;
   a source electrode and a drain electrode, wherein the source electrode and the drain electrode are positioned on the insulating layer;
   a semiconductor channel layer disposed on the insulating layer, wherein the semiconductor channel layer connects the source electrode and the drain electrode;
   a first passivation layer covering the semiconductor channel layer, the source electrode and the drain electrode, wherein the first passivation layer includes silicon oxide; and
   a second passivation layer disposed on the first passivation layer, wherein the second passivation layer includes silicon nitride, and the second passivation layer has a hydrogen concentration of about $2.0 \times 10^{22}$ atom/cm$^3$ to about $3.11 \times 10^{22}$ atom/cm$^3$.

2. The semiconductor device according to claim 1, wherein the second passivation layer has a thickness of about 300 angstrom to about 700 angstrom.

3. The semiconductor device according to claim 1, wherein the first passivation layer has a thickness of about 1000 angstrom to about 3000 angstrom.

4. The semiconductor device according to claim 1, further comprising a channel protective layer, wherein the channel protective layer is disposed between the semiconductor channel layer and the first passivation layer, and the channel protective layer overlaps the semiconductor channel layer in a perpendicular projection direction.

5. The semiconductor device according to claim 4, wherein a material of the channel protective layer comprises silicon oxide.

6. The semiconductor device according to claim 1, wherein the semiconductor channel layer is disposed on the source electrode and the drain electrode, and a side of the semiconductor channel layer covers a portion of the source electrode, and another side of the semiconductor channel layer covers a portion of the drain electrode.

7. The semiconductor device according to claim 1, wherein the semiconductor channel layer is disposed between the insulating layer, the source electrode and the drain electrode, wherein a portion of the source electrode covers a side of the semiconductor channel layer, and a portion of the drain electrode covers another side of the semiconductor channel layer.

8. The semiconductor device according to claim 1, wherein the semiconductor channel layer overlaps the gate electrode in a perpendicular projection direction.

9. The semiconductor device according to claim 1, wherein the semiconductor channel layer comprises at least one metal oxide material selected from the group consisting of indium-gallium-zinc oxide (IGZO), indium-zinc oxide (IZO), indium-gallium oxide (IGO), zinc oxide (ZnO), cadmium oxides.germanium dioxide ($2CdO.GeO_2$), nickel cobalt oxide ($NiCo_2O_4$) and a combination thereof.

10. The semiconductor device according to claim 1, further comprising:
a planarization layer covering the second passivation layer, wherein the first passivation layer, the second passivation layer and the planarization layer respectively have a first opening, a second opening and a third opening, wherein the first opening, the second opening and the third opening are communicated with each other to expose the drain electrode; and
a pixel electrode positioned on a portion of the planarization layer, wherein the pixel electrode contacts and electrically connects to the drain electrode through the first opening, the second opening and the third opening.

* * * * *